US012577652B2

(12) United States Patent
Edwards et al.

(10) Patent No.: US 12,577,652 B2
(45) Date of Patent: Mar. 17, 2026

(54) DECORATIVE COATING EXCLUDING A BASE HARD-COAT

(71) Applicant: MOTHERSON INNOVATIONS COMPANY LIMITED, London (GB)

(72) Inventors: Scott Edwards, Lonsdale (AU); Simon David Field, Lonsdale (AU); Bastian Stoehr, Lonsdale (AU)

(73) Assignee: Motherson Innovations Company Limited, London (GB)

( * ) Notice: Subject to any disclaimer, the term of this patent is extended or adjusted under 35 U.S.C. 154(b) by 0 days.

(21) Appl. No.: 18/261,022

(22) PCT Filed: Jan. 12, 2022

(86) PCT No.: PCT/EP2022/050554
§ 371 (c)(1),
(2) Date: Jul. 11, 2023

(87) PCT Pub. No.: WO2022/152756
PCT Pub. Date: Jul. 21, 2022

(65) Prior Publication Data
US 2024/0102149 A1     Mar. 28, 2024

(30) Foreign Application Priority Data

Jan. 14, 2021     (AU) ................................. 2021900071

(51) Int. Cl.
*C23C 14/20*          (2006.01)
*C23C 14/02*          (2006.01)

(52) U.S. Cl.
CPC ............ *C23C 14/20* (2013.01); *C23C 14/024* (2013.01)

(58) Field of Classification Search
CPC .............................. C23C 14/20; C23C 14/024
See application file for complete search history.

(56) References Cited

U.S. PATENT DOCUMENTS

2010/0036012 A1*  2/2010  Kimura ..................... C08F 2/44
                                                        522/172
2012/0052321 A1   3/2012  Thomas
                          (Continued)

FOREIGN PATENT DOCUMENTS

CN          1460063 A     12/2003
CN        101547947 A      9/2009
                 (Continued)

OTHER PUBLICATIONS

Patent Cooperation Treaty, PCT/EP2022/050554, International Search Report and Written Opinion of the International Searching Authority, May 6, 2022.
(Continued)

*Primary Examiner* — Dah-Wei D. Yuan
*Assistant Examiner* — Kristen A Dagenais
(74) *Attorney, Agent, or Firm* — Jones Day

(57)          ABSTRACT

The disclosure refers to a method for producing a coated plastic article, the method comprising:
  nnnnn. providing a plastic substrate having at least a first and second surface;
  ooooo. depositing on the plastic substrate a decorative coating comprising a metal or metal alloy layer, using physical vapor deposition; and
  ppppp. applying a protective coating to at least the first surface of the plastic article,
  wherein there is no plasma pre-treatment of the plastic substrate prior to deposition of the decorative coating. Further, the disclosure refers to a coated plastic article comprising; a plastic substrate having a first and second surface, a decorative coating comprising a metal or metal alloy layer deposited directly on the plastic substrate and a protective coating applied to the first surface of the plastic article, wherein the residual stress
                    (Continued)

of the decorative coating is tensile, and the coated plastic article passes the SAEJ2527 accelerated UV test.

23 Claims, 3 Drawing Sheets

(56)                    References Cited

U.S. PATENT DOCUMENTS

| | | | |
|---|---|---|---|
| 2013/0194687 A1* | 8/2013 | Hall | G02B 5/0808 |
| | | | 359/884 |
| 2017/0015802 A1* | 1/2017 | Hall | C23C 14/205 |
| 2022/0384940 A1* | 12/2022 | Caruso | H01Q 1/422 |

FOREIGN PATENT DOCUMENTS

| | | |
|---|---|---|
| CN | 102612570 A | 7/2012 |
| CN | 105228756 A | 1/2016 |
| CN | 106457753 A | 2/2017 |
| DE | 202013010250 | 11/2013 |
| KR | 2007-0032049 A | 3/2007 |
| WO | WO 2011/075796 A1 | 6/2011 |
| WO | WO 2020/078916 | 4/2020 |

OTHER PUBLICATIONS

CNIPA, Appl. 202280017126.2, First Office Action, Jul. 9, 2025.

* cited by examiner

DECORATIVE COATING EXCLUDING A BASE HARD-COAT

CROSS-REFERENCE TO RELATED APPLICATIONS

The present application is a National Stage Entry of International Patent Application No. PCT/EP2022/050554, filed Jan. 12, 2022, which claims the benefit of priority to AU Provisional Patent Application No. 20/219,00071, filed Jan. 14, 2021, each of which are hereby incorporated by reference in their entirety for all purposes.

TECHNICAL FIELD

The present invention relates to decoratively coated plastic substrates, which provide plastic articles. The plastic articles of the invention have sufficient resilience and wear properties to be used in automotive applications, such as for use in providing internal trim and components. Specifically, the present invention relates to an improved method for preparing plastic articles and plastic articles produced by such methods.

BACKGROUND OF INVENTION

As more technology is integrated into automobiles, the demand on the materials used increases. As an array of sensors and display elements are increasing integrated into vehicles there is a growing need for materials which are aesthetically pleasing, or mimic the look of traditional materials, but have improved versatility and are compatible with the underlying components.

As a result, the use of external and internal plastic components has increased. Plastic components have many attractive properties including resistance to breaking, low cost, light weight, ability to be shaped and moulded and in some applications their transparency. However, such plastic components do not necessarily meet the visual requirements and wear requirements needed for automotive applications. By coating plastic substrates components can be provided which meet the desired visual aesthetic while also improving the wear resistance of the underlying plastic substrate.

A range of technologies for applying thin film coatings to plastic substrates have been developed. These techniques, such a physical vapour deposition, aim to provide a thin film coating to either the first or second surface of a plastic substrate. However, the thermal expansion coefficients of the deposited films (in particular metal and metal alloy films) are often an order of magnitude different to the plastic substrate and therefore films on plastic substrates are prone to failure and crazing during use. This is particularly problematic in applications such as vehicles where both internal and external components are exposed to harsh elements, high UV light and relatively high temperatures. Therefore, to prevent failure of the film it is important to modulate the stress at the interface between the deposited decorative film coating and the substrate and to promote strong adhesion between the plastic substrate and deposited film coating.

To achieve strong adhesion, plastic substrates (such as polycarbonate), are often pre-treated to improve surface characteristics such as roughness (see for example S Pelagade et al. 2010 J. Phys.; Conf. Ser. 208; 012107). One important pre-treatment is plasma pre-treatment (see Pelagade et al. 2010—ibid; Seidel C, et al. 1999 Appl. Surface Sci. 150, pp. 19-33; Hofrichter A, et al. 2002, J. Vacuum Sci. & Tech. A 20, pp. 245-250; Hegemann D, et al. 2003, Nucl.

Instrum. & Meth. B., 208, pp. 281-286; Boldyryeva H et al. 2004, Nucl. Instrum. & Meth. B., 219-220, pp. 953-958; and Kitova S et al. 2005, J. Optoelectronics and Advanced Materials, 7, pp. 2607-2612). Plasma pre-treatment has a range of effects on the plastic substrate, including modifying the roughness of the surface, modifying surface polymer groups and increasing the surface energy (and wettability). As such, plasma pre-treatment provides many advantages which improve the adhesion between a plastic substrate and a subsequently deposited thin film is an essential and routine step in depositing films onto plastic substrates.

Generation of plasma also produces ultraviolet (UV) radiation. The exposure of the plastic substrate to UV radiation degrades the outermost exposed surface of the plastic substrate. This degradation can later cause cohesive failure at the substrate-coating interface, particularly when the coated plastic article is exposed to further UV light during use. The reason for this failure is because the deposited coatings are, by necessity, thin and therefore permit light transmission. This means that UV exposure during use can traverse the decorative coating and interact with the underlying substrate. This UV radiation exposure of the substrate can result in damage—or in the case of prior UV exposure, further damage—particularly at the upper surface of the substrate interfacing with the decorative coating, thereby causing cohesive failure.

To prevent UV radiation damage of the plastic substrate it has become essential to provide a protective base coating to the substrate prior to plasma pre-treatment. This protective base coating reduces the transmission of UV light during plasma pre-treatment and also acts as an intermediate layer which modulates stress between the substrate and an applied film coating. However, the use of the protective base coating adds significant time and cost to the manufacturing process. Further, the base coating fills and smooths over variations and textures in the substrate. While in some circumstances this is desirable, in others it is problematic as it prevents the formation of visual texturing of the plastic article. Therefore, there is a need to provide a lower cost and more efficient method for producing a plastic article having a decorative coating which can pass durability testing for applications such as automotive use.

SUMMARY OF INVENTION

The present invention provides a method of producing a decoratively coated plastic article whereby the plastic substrate does not need to be coated with a protective coating prior to deposition of the decorative coating, while still maintaining sufficient durability for automotive use. Accordingly, the present invention provides an improved method for producing a plastic article. The present invention may also, in some embodiments, permit the inclusion of fine visual texturing in the substrate.

Specifically, the present invention provides a method for producing a coated plastic article, the method comprising: (a) providing a plastic substrate having at least a first and second surface; (b) depositing on the plastic substrate a decorative coating comprising a metal or metal alloy layer, using physical vapor deposition; and (c) applying a protective coating to the first surface of the plastic article, wherein there is no plasma pre-treatment of the plastic substrate prior to deposition of the decorative coating. In some preferred embodiments, the decorative coating is deposited on at least the first surface of the plastic substrate, and the protective coat is applied directly to the decorative coating.

The use of plasma pre-treatment is standard in the industry to facilitate sufficient adhesion of a deposited coating to plastic substrates. However, as discussed herein, the UV radiation generated during this process damages the plastic substrate and therefore requires the earlier application of a protective base coating, which can also tune the stress at the interface between the substrate and a deposited coating.

However, in some embodiments of the present invention the decorative coating is deposited directly on the plastic substrate, without the need for a protective coating (such as Momentive PHC587B or AS4700F) to first be applied to the plastic substrate. In these embodiments, the metal or metal alloy layer directly interfaces with the plastic substrate and therefore acts as both a visual layer (providing a metal appearance) and a protective layer for the substrate. Further, the deposited metal or metal alloy layer facilitates adhesion of subsequent layers in the decorative coating. The metal or metal alloy layer absorbs and reflects a significant portion of light, including UV light, and as such protects the underlying substrate from subsequent exposure to UV light which may happen during use or when additional layers of the decorative coating are deposited. Further, in some preferred embodiments, the metal or metal alloy layer acts as the primary stress controlling layer of the decorative coating and interfaces with the substrate. In some embodiments, additional layers may be deposited at the interface with the substrate, and between the metal and metal alloy layer. These layers may provide additional optical properties (such as masking light transmission or tuning the colour of the decorative layer) or may control the overall residual stress of the decorative coating.

As (in some embodiments) the decorative coating directly interfaces with the plastic substrate, and because no plasma pre-treatment is performed to enhance adhesion, it is critical to maximise the adhesion of the decorative coating with the plastic substrate. This can be achieved by controlling the residual stress of the decorative coating. Therefore, in some embodiments, the decorative coating is deposited under conditions that result in a tensile residual film stress of the decorative coating.

The residual stress within a film can be measured and is usually reported as a pressure (e.g. MPa). It can also be reported as displacement which represents the deflection of the underlying substrate after the coating is applied. The displacement is determined by the stress within the coating, the thickness of the coating and the properties of the underlying substrate. Accordingly, a thicker coating having a lower stress profile (as measure in MPa) can exert the same stress displacement on a substrate as a thinner coating with a higher stress profile. Therefore, in some preferred embodiments, the residual stress of the decorative coating is measured as stress displacement. In some embodiments, the stress displacement is measure using a glass slide as the substrate. In some embodiments, the thickness of the glass slide is about 150 μm.

In some embodiments, the decorative coating is deposited under conditions that result in a residual film stress displacement of less than or equal to −50 μm, when deposited. In some further embodiments, the decorative coating is deposited under conditions that result in a residual film stress displacement of less than or equal to −240 μm, when deposited. In some further embodiments, the decorative coating is deposited under conditions that result in a residual film stress displacement of less than −765 μm, when deposited.

The decorative coating of the present invention is provided with a protective coating which forms the forward-most coating of the produced plastic article when in use. Accordingly, the protective coating is exposed to the elements. In embodiments of the invention wherein the decorative coating is provided to the first surface of the substrate, the protective coating is deposited directly on the decorative coating and protects the underlying coating. In some alternative embodiments, the decorative coating is provided on the second surface of the plastic substrate and the protective coating is provided to the first surface thereby protecting the underlying plastic substrate. However, in some embodiments, the decorative coating is applied to both the first side and the second side of the plastic article thereby covering the decorative coating and the opposing surface of the plastic substrate. In certain embodiments, the protective coating envelopes the decoratively coated plastic substrate.

In some embodiments, the protective coating is a hard-coating. In some embodiments, the protective coating is an ultraviolet blocking coating. In some embodiments, the protective coating is Momentive PHC587B or AS4700F.

The decorative coating, which comprises the metal or metal alloy layer, can also comprise additional layers which can adjust the properties of the decorative coating. In such embodiments, the decorative coating can comprise a 'stack' of layers of different materials. For example, additional layers can tune the overall residual stress of the decorative coating, can alter the visual appearance of the decorative coating or can facilitate adhesion of the decorative coating to subsequent treatments or layers, such as the aforementioned protective coating. Therefore, in certain embodiments, the decorative coating also comprises an adhesion controlling layer (also referred herein as adhesion promoting layer). In some embodiments, the decorative coating also comprises an optical modifying layer.

In some embodiments, the optical modifying layer and/or adhesion promoting layer is the outermost layer of the decorative coating. As such, in some embodiments, this layer directly interacts with a provided protective coating and is the first layer visualised. Accordingly, it may be advantageous for some embodiments to have an optical modifying layer and/or adhesion promoting layer which is transparent. In some embodiments, the optical modifying layer and/or adhesion promoting layer are the same layer.

In some embodiments, the optical modifying layer and/or adhesion promoting layer comprises silicon. In some embodiments, the silicon is deposited in the presence of oxygen. In some embodiments, the deposited optical modifying layer and/or adhesion promoting layer is silicon dioxide.

In some embodiments the metal or metal alloy of the decorative coating includes chromium (Cr), aluminium (Al), titanium (Ti), nickel (Ni), molybdenum (Mo), zirconium (Zr), tungsten (W), silicon (Si), niobium (Nb), tantalum (Ta), vanadium (V), cobalt (Co), manganese (Mn), silver (Ag), zinc (Zn), indium (In), germanium (Ge), tin (Sn) and mixtures thereof; and an oxide, nitride, boride, fluoride or carbide thereof, and mixtures thereof. In one embodiment, metal or metal alloy is selected from chromium (Cr), zirconium (Zr), aluminium (Al), titanium (Ti), germanium (Ge), indium (In), copper (Cu), cobalt (Co) and/or molybdenum (Mo). Other metals or metal alloys are also suitable. In one embodiment mixtures of any of the aforementioned metals or metal alloys may be used.

In some embodiments of the invention, the metal or metal alloy layer comprises chromium. In some embodiments, the metal or metal alloy layer comprises zirconium. In certain embodiments, the metal layer consists of chromium. In certain embodiments, the metal alloy is chromium and zirconium. In some embodiments, the atomic ratio of chromium to zirconium is 197:3.

It may be desirable to permit selective light transmission through the coated plastic article. Therefore, in some embodiments, the method further comprises providing a mask to the plastic substrate to provide a portion of controlled light transmission. This mask can be provided on the second surface, or on the first surface of the substrate underlying the decorative coating. The mask may comprise an opaque coating (PVD, ink or paint), an adhesive masking film, film insert moulding or two component injection moulding. This can therefore provide visual symbols within the produced plastic article that can be illuminated by way of backlighting.

An advantage of not using a protective coating on the interfacing surface of the plastic substrate and decorative coating is that fine undulations and textures in the substrate are not smoothed out during application of the protective coating. Therefore, the plastic substrate can be provided with texturing prior to application of the decorative coating which results in texturing of the decorative coating. Accordingly, this texturing is visible in the finished plastic article. This allows for a greater range of designs to be integrated into the plastic article. Therefore, in some embodiments the provided plastic substrate comprises visible texturing prior to deposition of the decorative coating. In some embodiments, the method further includes providing a visible texturing to the plastic substrate. In certain embodiments, the plastic substrate is provided with, or comprises, two or more visually distinct textures.

Design freedom is further improved by using a plastic substrate, compared to other substrates such as glass or metal. One particular advantage of plastic is its ability to be shaped and moulded. Therefore, in some embodiments the plastic substrate is injection moulded, has been injection moulded or is formed of a plastic which is capable of being injection moulded. One such suitable plastic is polycarbonate. Therefore, in some embodiments, the plastic substrate is polycarbonate.

Importantly, the present invention provides for the production of plastic articles which are sufficiently resilient for use in automotive applications. Of particular importance is the ability to withstand damage and delamination as a result of UV light exposure. Therefore, in some embodiments, the method described herein can produce an article which passes the SAEJ2527 accelerated UV test.

Also provided by the present disclosure is a coated plastic article comprising: a plastic substrate having a first and second surface, a decorative coating comprising a metal or metal alloy layer deposited directly on the plastic substrate and a protective coating applied to the first surface of the plastic article, wherein the residual stress of the decorative coating is tensile and the coated plastic article passes the SAEJ2527 accelerated UV test.

In some embodiments of the plastic article the residual film stress displacement of the decorative coating is less than or equal to −50 μm, or is less than or equal to −240 μm, or is less than or equal to −765 μm.

In some embodiments, the protective coating of the coated plastic article is a hard-coating and/or an ultraviolet blocking (absorbing or reflecting) coating. In some embodiments, the protective coating is Momentive PHC587B or AS4700F.

In some embodiments, the coated plastic article comprises visible texturing on the plastic substrate. In some embodiments, the coated plastic article comprises multiple different visible textures.

In some embodiments of the coated plastic article, the metal or metal alloy layer is in direct contact with the plastic substrate.

In some embodiments of the coated plastic article, the protective coating is provided on the surface of the article having the decorative coating. In some embodiments, the protective coating is provided on the surface having the decorative coating and the opposing surface of the plastic substrate. In some embodiments, the protective coating covers only the surface of the article opposite the decorative coating. In the latter embodiment, the decorative coating is a second surface coating and as such the protective coating protects the first surface of the substrate and the decorative coating is viewed through the substrate.

In some embodiments of the coated plastic article, the metal or metal alloy layer comprises chromium. In some embodiments, the metal or metal alloy layer comprises chromium (Cr), aluminium (Al), titanium (Ti), nickel (Ni), molybdenum (Mo), zirconium (Zr), tungsten (W), silicon (Si), niobium (Nb), tantalum (Ta), vanadium (V), cobalt (Co), manganese (Mn), silver (Ag), zinc (Zn), indium (In), germanium (Ge), tin (Sn) and mixtures thereof; and an oxide, nitride, boride, fluoride or carbide thereof, and mixtures thereof. In some embodiments, the metal or metal alloy layer comprises zirconium (Zr), aluminium (Al), titanium (Ti), germanium (Ge), indium (In), copper (Cu), cobalt (Co) and/or molybdenum (Mo). In some embodiments, the metal alloy is chromium and zirconium.

In some embodiments of the coated plastic article, the decorative coating also comprises an adhesion controlling layer and/or an optical modifying layer. As is to be understood, the adhesion controlling layer and optical modifying layer may be the same material, or the same layer. In some embodiments, the optical modifying layer and/or adhesion promoting layer is transparent. In some embodiments, the optical modifying layer and/or adhesion promoting layer comprises silicon. In some embodiments, the optical modifying layer and/or adhesion promoting layer comprises silicon dioxide.

In some embodiments, the plastic article is provided with a mask to provide a portion of controlled light transmission. In some embodiments, the portion of controlled light transmission forms a symbol.

In some embodiments of the plastic article, the plastic substrate has been injection moulded or is formed of a plastic which is capable of being injection moulded. In some embodiments, the plastic substrate is polycarbonate.

There is also provided a system comprising a plastic article described herein, or produced by the method described herein, and a lighting system for back lighting at least a portion of the plastic article. Such a system is particularly envisaged for use with embodiments of the invention having a portion of controlled light transmission.

BRIEF DESCRIPTION OF DRAWINGS

Embodiments of the invention are discussed herein by reference to the drawings which are not to scale and are intended merely to assist with explanation of the invention. Further, examples provided herein are not intended to limit the scope of the invention as described and are intended to disclosure particular embodiments of the invention.

DETAILED DESCRIPTION

Figure 1:
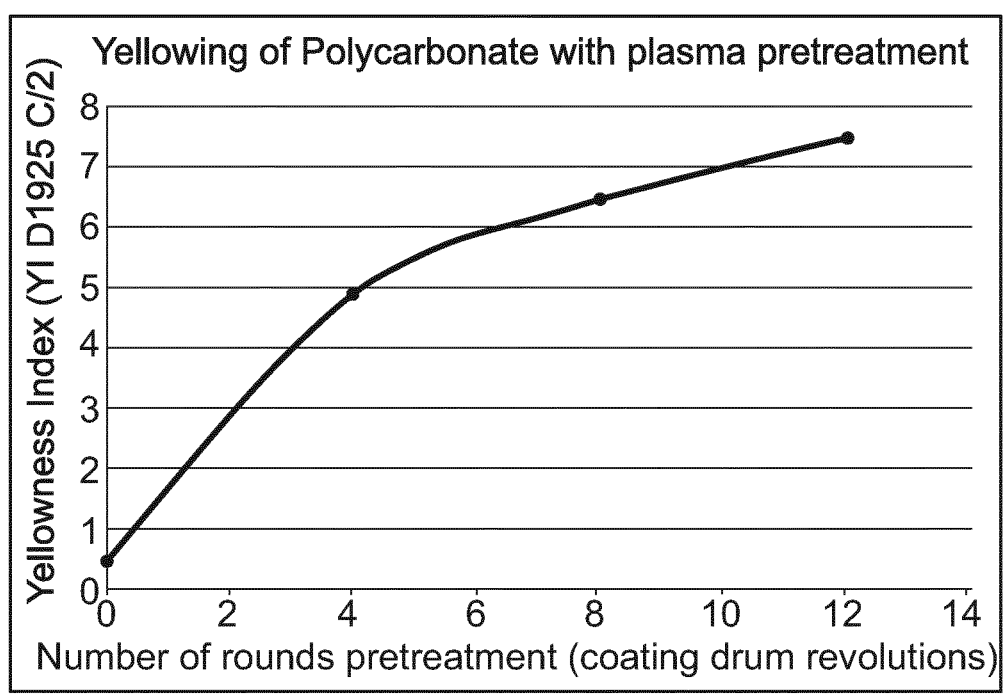
FIG. 1 demonstrates the UV damage of polycarbonate, as evidenced by yellowing, as a result of exposure to plasma pre-treatment.

Throughout the specification reference will be made to layers in relation to the plastic substrate and in relation to each other. Therefore, in order to define the spatial relationship of the coating in relation to the substrate, and the spatial relationship between layers included in the coating, the following terminology will be used.

"First side" is to be understood as the side of the substrate, coating, or specific layer which in-use faces toward the external environment. In the specific context of a vehicle, this would be the visible surface.

"Second side" is to be understood as the opposing side to the first side. In an in-use context this is the side facing inward away from the external environment. Typically, the second side is not visible when the plastic article is used.

"First surface" is to be understood to refer to the surface on the first side of a substrate, coating, or specified layer.

"Second surface" is to be understood to refer to the surface on the second side of a substrate, coating, or specified layer.

The present invention provides a method for producing a coated plastic article, and also provides a coated plastic article. Specifically, provided is a method comprising: (a) providing a plastic substrate having a first and second surface; (b) depositing on the plastic substrate a decorative coating comprising a metal or metal alloy layer, using physical vapor deposition; and (c) applying a protective coating to the first surface of the plastic article, wherein there is no plasma pre-treatment of the plastic substrate prior to deposition of the decorative coating. The decorative coating can be applied to at least the first surface of the substrate or to at least the second surface of the plastic substrate. However, it is preferred that the decorative coating is a first surface coating. According to the present invention, one or more metal or metal alloy layers may be applied.

While coated plastic articles in accordance with the present invention can be used for any application, one envisaged application is for automotive uses particularly interior automotive uses where design freedom and visual finish are important. As will be understood by those skilled in the art, the interior of an automobile is often exposed to high temperatures (>50 degrees Celsius) as well as UV light. As such, these interior components need to be of sufficient durability to withstand such conditions.

Such temperatures, and exposure to UV light can be problematic for plastic articles, especially those which are coated with thin metal or metal alloy coatings Typically, metal or metal alloy coatings have coefficients of thermal expansion an order of magnitude lower than the plastic substrate. Therefore, in the absence of sufficient adhesion between the plastic substrate and a decorative coating, the coating may fail and lead to crazing and delamination of the coating. To this end, exposure of the plastic substrate to UV light, particularly before the deposition of the metal or metal alloy layer, can lead to poor performance of the coating.

UV radiation degrades plastics, such as polycarbonate, which are typically used for automotive purposes. When exposed to UV light the first surface of the plastic substrate is degraded and this can lead to cohesive failure between the substrate and an applied coating, particularly when the coated article is further exposed to UV radiation (see U. Schulz et al., Applied Optics, vol. 47, no. 13, pp. C83-C87, 2007; C. Lee et al., Thin Solid Films, vol. 295, pp. 122-124, 1997; and E. Liston et al., Journal of Adhesion Science Technology, vol. 7, pp. 1091-1127, 1993).

As standard, physical vapour deposition methods pre-treat the plastic substrate with a plasma beam which improves some of the characteristics of the surface of the plastic substrate. However, the use of plasma pre-treatment also exposes the plastic substrate to UV light. When clear polycarbonate is used, this results in yellowing of the polycarbonate (see A. Rivaton, Polymer Degradation and Stability, vol. 49, pp. 163-179, 1995; A. Rivaton, et al., Polymer Photochemistry, vol. 3, pp. 463-481, 1983; A. Rivaton et al., Polymer Degradation and Stability, vol. 75, pp. 17-33, 2002 and A. Rivaton et al., European Polymer Journal, vol. 38, pp. 1349-1363, 2002). This is demonstrated in FIG. 1 which shows an increase in yellowing (YID) with increasing rounds of plasma pre-treatment. Typically, 12 rounds of plasma pre-treatment are used prior to coating a plastic substrate.

To prevent UV radiation damage, the plastic substrate is provided with a protective coating prior to plasma pre-treatment. This blocks the UV generated during plasma treatment thereby allowing for the advantages of plasma pre-treatment without the UV degradation. However, this coating and pre-treatment adds significant time and cost to the coating process. The present invention forgoes plasma pre-treatment, and thereby negates the need for the application of a protective coating to the plastic substrate prior to coating, while still meeting the durability requirements for use in automotive purposes, in particular interior automotive purposes.

The substrate used in the present invention can be any suitable substrate that is for the intended purpose of the plastic article. However, preferably the plastic substrate is a synthetic polymer, such as: acrylonitrile ethylene styrene (AES), acrylonitrile butadiene styrene (ABS), acrylonitrile styrene acrylate (ASA), polyamide (PA), polybutylene terephthalate (PBT), polycarbonate (PC), polyethylene (PE), polyethylene teraphthalate (PET), poly(methyl methacrylate) (PMMA), polyoxymethylene (POM), polypropylene (PP), polyurethane (PU), polyvinylchloride (PVC), high-flow AES, acrylonitrile-(ethylene-propylene-diene)-styrene (AEPDS), blends of thermoplastics, or PC-ABS blended thermoplastic. In some embodiments, the substrate is polycarbonate.

Ideally the substrate is formed in its desired shape prior to deposition of the decorative film. In some embodiments, the substrate is provided formed in the desired shape. In other embodiments, the method of the invention includes forming or shaping the substrate. For example, the substrate can be injection moulded prior to application of the decorative coating.

The decorative coating comprising a metal or metal alloy layer can be applied to the plastic substrate in any suitable physical vapour deposition (PVD) method. For example, deposition of one or more layers of the decorative coating may be done by thermal evaporation, electron beam evaporation (with or without ion beam assistance), sputter deposition, pulsed laser deposition, cathodic arc deposition or electrohydrodynamic deposition. Sputter deposition is the preferred method.

The components of the metal or metal alloy layer will be selected by a skilled person based on the desired physical and visual properties of coating. Different metals or metal alloys have different stress profiles and a skilled person can determine these and tune the residual stress of the coating (and any respective layers) to fall within the stress displacement ranges of the invention. In some embodiments, the metal or metal alloy includes one or more of: chromium (Cr), zirconium (Zr), aluminium (Al), titanium (Ti), germanium (Ge), indium (In), copper (Cu), cobalt (Co) or molybdenum (Mo). In some embodiments, the metal or metal alloy comprises one or more of the above.

However, in some embodiments the metal or metal alloy coating comprises chromium, or an alloy of chromium. In some embodiments, the metal alloy includes zirconium. In some embodiments, the metal alloy comprises zirconium. In some embodiments, the metal is chromium. In some embodiments, the metal alloy is chromium and zirconium. In some embodiments the metal alloy comprises chromium and zirconium. In some embodiments the concentration of zirconium in the alloy is 10% or less atomic percent (at %), 7.5 at % or less, 5 at % or less, 4 at % or less, 3 at % or less, 2 at % or less or about 1.5 at %.

The deposited metal or metal alloy layer performs several important functions. Primarily, it acts as visual layer (optionally in combination with other layers in the decorative coating) providing a desired aesthetic, such as a chrome or stainless-steel aesthetic. Further, when deposited on the first surface of the plastic substrate, it acts as a light absorbing layer thereby reducing the exposure of the substrate to UV light during use. Finally, it directly interfaces with the plastic substrate thereby forming a stress controlling layer. This is distinct to typical PVD deposited decorative coatings that utilise an intermediate layer between the substrate and the metal or metal alloy layer to control the stress differential between the two.

The properties of the deposited decorative coating are critical in ensuring suitable adhesion to the plastic substrate. An important factor is the residual stress of the decorative coating. As demonstrated in the examples, decorative coatings comprising chromium and zirconium having a compressive residual stress fail UV resistance testing (as per SAEJ2527). Therefore, in some preferred embodiments, the decorative coating is deposited under conditions that result in a tensile residual film stress displacement of the decorative coating. Preferably, the decorative coating is deposited under conditions that result in a residual film stress displacement of the deposited decorative coating of less than or equal to −50 μm, less than or equal to −240 μm or less than or equal to −765 μm.

"Residual stress" refers to stresses that are not the result of directly applied loads or of differential thermal expansion between the coating and its substrate or between different layers in the coating. Methods are known in the art for assessing the residual stress and stress displacement of the deposited decorative coating, such as those described in the examples included herein.

The decorative coating may comprise layers in addition to the metal or metal alloy layer. These additional layers may be used to tune the residual stress of the decorative coating, modify the visual properties of the decorative coating or modify other properties of the decorative coating, such as improving external adhesiveness.

In some embodiments, the decorative coating may comprise a series of stacked layers. For example, the publication WO 2015/131223 (which is herein incorporated in its entirety) discloses coatings comprising multiple layers of absorbing and transmitting layers. Particularly disclosed are layers of chromium and zirconium alloy alternating with silicon dioxide layers. By modifying the thickness and the number of the layers different visual effects could be produced. Accordingly, in some embodiments of the present invention, the decorative coating comprises an additional layer, such as an optical modifying layer or an adhesion control layer. In some embodiments these two functions are provided by the same layer. In other embodiments, these two functions are provided by different layers.

As used herein an optical modifying layer is a layer that can be included in addition to the metal or metal alloy layer which modifies the overall visual appearance of the decorative coating. This layer can either be transparent or opaque (or having degrees of transparency/opacity). However, in some embodiments the optical modifying layer is transparent.

An adhesion modifying layer, as used herein, refers to a layer which improves adhesion to the decorative coating. This may include a layer at the interface between the substrate and the metal or metal alloy layer (which is not a protective coating) or a layer on the outer most surface of the decorative coating which facilitates improved adhesion to the decorative coating. In this latter embodiment, it is desirable for the adhesion promoting layer to be transparent.

Particularly preferred optical modifying layers, and adhesion promoting layers comprise silicon. When deposited in the presence of oxygen silicon dioxide is formed. Therefore, in a preferred embodiment, the optical modifying layer(s) and/or adhesion promoting layer(s) comprise silicon dioxide. Indeed, silicon dioxide can perform the role of both an optical modifying layer and an adhesion promoting layer. In some embodiments, the decorative coating includes multiple layers of silicon dioxide and may also include multiple layers of a metal or metal alloy, such as chromium/zirconium.

The addition of further layers can modify the overall residual stress of the decorative coating. Silicon dioxide, for example, when deposited is compressive in nature and therefore inclusion of silicon dioxide in the decorative layer moves the overall residual stress toward compressive. As it is important to maintain the overall residual stress of the decorative layer as tensile, the thickness of any deposited silicon dioxide layers, or the number of deposited silicon layers, needs to be coordinated so as not to make the overall residual stress compressive.

Figure 2:
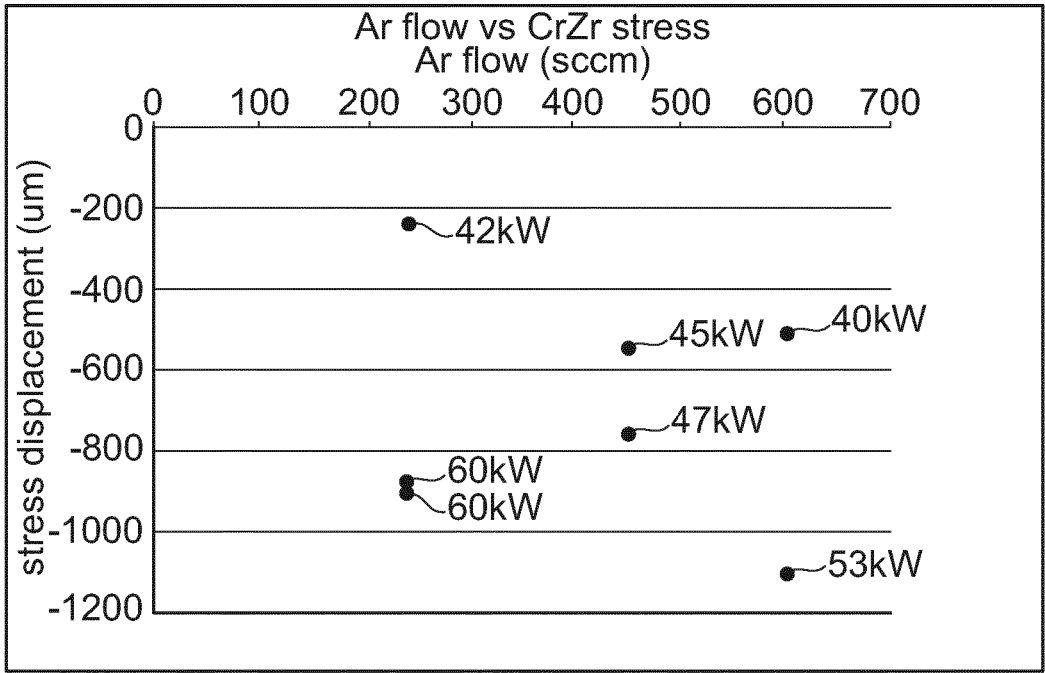
FIG. 2 demonstrates the interaction of voltage and gas flow in influencing the tensile stress of deposited chromium and zirconium alloy thin films.

Further, the deposition parameters of the metal layer can be adjusted to modify the tensile stress of the metal or metal alloy layer once deposited. Of particular importance is the power used during deposition of the layer and the gas flow during deposition. As demonstrated in FIG. 2, increasing the gas flow (e.g. argon gas flow) while maintaining the target power during deposition will increase the residual tensile stress of the deposited coating (i.e. make it more tensile thereby making the stress displacement more negative). Further, increasing the target power while maintaining the gas flow will also increase the residual tensile stress in the deposited coating.

The deposition parameters can also modify the optics of the final deposited coating and this can be determined by a skilled person and tuned for their desired application and aesthetics.

Subsequent to the application of the decorative coating to the plastic substrate, a protective coating is applied. This protective coating can be applied only to one surface of the plastic article (e.g. by spray coating) or can be applied to both surfaces of the plastic article (e.g. by dip coating). Preferably the protective coating is applied to the first surface of the plastic article. Therefore, in embodiments where the decorative coating is a first surface coating the protective coating is applied to the decorative coating.

In some embodiments, the coating protects against weathering, and in particular absorbs or reflects UV light. In some embodiments, the protective coating is a hard-coating. In this respect, a coating that is said to be a "hard-coating" is a coating that is harder and stiffer than the substrate, whereby it increases the abrasion resistance of that substrate. Such an abrasion resistant hard-coating is one that reduces damage due to impacts and scratching. Abrasion resistance can be measured through tests such as ASTM F735 "Standard Test Method for Abrasion Resistance of Transparent Plastics and Coatings Using the Oscillating Sand Method", ASTM D4060 "Standard Test Method for Abrasion Resistance of Organic Coatings", by the Taber Abrader, or by using the well-known Steel wool Test.

Furthermore, some plastic substrates can be damaged by certain solvents; for example, polycarbonate is damaged by acetone. It is a requirement for many products that might be suited to the decorative coating of the present invention that they be "chemically resistant", which is a reference to an ability to withstand exposure to normal solvents such as diesel fuel, petroleum, battery acid, brake fluid, antifreeze, acetone, alcohol, automatic transmission fluid, hydraulic oil and ammonia based window cleaners. In this respect, it will be appreciated that a hard-coating ideally provides a product bearing the decorative coating of the present invention with such chemical resistance.

A hard-coating is preferably formed from one or more abrasion resistant layers and may include a primer layer that bonds well to decorative layer and forms a preferable material for subsequent abrasion resistant layers. The primer layer may be provided by any suitable material and may for example be an organic resin such as an acrylic polymer, a copolymer of acrylic monomer and methacryloxysilane, or a copolymer of a methacrylic monomer and an acrylic monomer having a benzotriazole group or benzophenone group. These organic resins may be used alone or in combinations of two or more.

The abrasion resistant layers are preferably formed from one or more materials selected from the group consisting of an organo-silicon, an acrylic, a urethane, a melamine or an amorphous $SiO_xC_yH_z$. Most preferably, the abrasion resistant layer is an organo-silicon layer, due to its superior abrasion resistance and compatibility with physical vapour deposited films. For example, an abrasion resistant layer comprising an organo-silicon polymer can be formed by forming a layer of a compound selected from the following compounds by a method such as dip coating or the like and then curing the layer: trialkoxysilanes or triacyloxysilanes such as methyltrimethoxysilane, methyltriethoxysilane, methyltrimethoxyethoxysilane, methyltriacetoxysilane, methyltripropoxysilane, methyltributoxysilane, ethyltrimethoxysilane, ethyltriethoxysilane, vinyltrimethoxysilane, vinyltriethoxysilane, vinyltracetoxysilane, vinyltrimethoxyethoxysilane, phenyltrimethoxysilane, phenyltriethoxysilane, phenyltriacetoxysilane, gamma-chloropropyltrimethoxysilane, gamma-chloropropyltriethoxysilane, gamma-chloropropyltripropoxysilane, 3,3,3-trifluoropropyltrimethoxysilane gamma-glycidoxypropyltrimethoxysilane, gamma-glycidoxypropyltriethoxysilane, gamma-(beta-glycidoxyethoxy)propyltrimethoxysilane, beta-(3,4-epoxycyclohexyl)ethyltrimethoxysilane, beta-(3,4-epoxycyclohexyl)ethyltriethoxysilane, gamma-methacryloxypropyltrimethyoxysilane, gamma-aminopropyltrimethoxysilane, gamma-aminopropyltriethoxysilane, gamma-meraptopropyltrimethoxysilane, gamma-mercaptopropyltriethoxysilane, N-beta(aminoethyl)-gamma-aminopropyltrimethoxysilane, beta-cyanoethyltriethoxysilane and the like; as well as dialkoxysilanes or diacyloxysilanes such as dimethyldimethoxysilane, phenylmethyldimethoxysilane, dimethyldiethoxysilane, phenylmethyldiethoxysilane, gamma-glycidoxypropylmethyldimethoxysilane, gamma-glycidoxypropylmethyldiethoxysilane, gamma-glycidoxypropylphenyldimethoxysilane, gamma-glycidoxypropylphenyldiethoxysilane, gamma-chloropropylmethyldimethoxysilane, gamma-chloropropylmethyldiethoxysilane, dimethyldiacetoxysilane, gamma-methacryloxypropylmethyldimethoxysilane, gamma-metacryloxypropylmethyldiethoxysilane, gamma-mercaptopropylmethyldimethoxysilane, gamma-mercaptopropylmethyldiethoxysilane, gamma-aminopropylmethyldimethoxysilane, gamma-aminopropylmethyldiethoxysilane, methylvinyldimethoxysilane, methylvinyldiethoxysilane and the like.

Commercially available hard coats include Momentive hard coats e.g. UVHC3000, UVHC5000, PHC587B/C, PHCXH100P and AS4700F. Each of these coatings has differing abrasion resistance, weatherability performance and deposition parameters. Accordingly, a skilled person will be able to select the appropriate coating for the intended purpose of the plastic article. In some preferred embodiments, the hard coating is Momentive PHC587B or AS4700F. In a most preferred embodiment, the hard coating is Momentive PHC587B.

The abrasion resistant layers may be coated onto the plastic article by dip coating in liquid followed by solvent evaporation, or by plasma enhanced chemical vapour deposition (PECVD) via a suitable monomer. Alternative deposition techniques such as flow coating and spray coating are also suitable. To improve the abrasion resistance of the hard-coating, subsequent coatings of the abrasion resistant layer may be added, preferably within a 48-hour period to as to avoid aging and contamination of the earlier coatings.

The application of the protective coating can influence the stress of the decorative coating. Therefore, in some embodiments, the residual stress of the decorative coating is the residual stress prior to any further treatment of the decorative coating, and particularly before application of the protective coating. Further, a skilled person will appreciate that the application of the protective coating can be modified to influence any additional stresses applied to the coated plastic article as a result of the protective coating. As known in the art, the protective coating itself may have residual stress when cured and this can be modified during application of the protective coating. Some examples of parameters that can be adjusted during application of the protective coating including the means of application (e.g. dip coating or spray coating), single-sided or double-sided application of the coating, the thickness of the applied coating, the use of a primer prior to application of the coating, the temperature of curing of the protective coating and the cooling rate of the coating (depending on the nature of the applied coating). Each of these factors can be changed, based on what is known in the art and the results can be assess based on known methods for assessing residual stress, including the method exemplified herein.

The protective coating, when applied over the decorative coating, can modify the appearance of the coating. In some embodiments, the protective coating incorporates a matting additive which is applied to coated plastic article. In this respect, it is known that a matt effect is achieved due to the diffusion effect produced by the small (usually ~5 μm) particles of a matt additive. By alteration of the protective coating through the addition of matting additives a "satin" appearance can also be achieved. This is characterised by a significant diffuse reflected component (for example diffuse reflection ~between 10% and 30%).

The plastic article of the invention, or produced by the method of the invention, can include additional visual features to improve its aesthetics or functionality. In some embodiments, the plastic substrate includes visible texturing. Accordingly, when the decorative coating is applied, the visible texturing appears in the coating. The application of a protective coating to a plastic substrate typically smooths the surface of the plastic substrate and often hides texturing in the substrate. In some contexts, this is desirable. However, often subtle visual texturing is desired and may not be achievable when a protective coating is applied to the substrate prior to deposition of the protective coating. However, the present invention alleviates this. Accordingly, in some embodiments, the plastic substrate has or is provided with visual texturing. In some embodiments, the plastic substrate has or is provided with two visually distinct textures.

As used herein a "visible texturing" is texturing apparent to the naked eye after deposition of the decorative coating and can be distinguished from a coated plastic substrate with a smooth surface. In some embodiments the visible texturing has a mean average roughness profile (Ra) of at least 0.5 μm. In some embodiments the visible texturing has a mean average Ra of at least 0.7 μm. In some embodiments the visible texturing has a mean average Ra of at least 0.9 μm. In some embodiments the visible texturing has a mean average Ra of at least 1 μm. In some embodiments the visible texturing has a mean average Ra of at least 1.2 μm. In some embodiments the visible texturing has a mean average Ra of up to 2 μm. In some embodiments the visible texturing has a mean average Ra of up to 1.8 μm. In some embodiments the visible texturing has a mean average Ra of up to 1.6 μm. In some embodiments the visible texturing has a mean average Ra of up to 1.5 μm. In some embodiments the visible texturing has a mean average Ra of up to 1.4 μm. In some embodiments the visible texturing has a mean average roughness profile (Ra) of 0.5 to 2 μm. In some embodiments, the visible texturing has a mean average roughness profile of 0.7 to 1.8 μm. In some embodiments, the visible texturing has a mean average roughness profile of 1 to 1.5 μm. In some embodiments, the visible texturing has a mean average roughness profile of about 1.2 μm.

As noted above, the present invention aims to permit the production of decoratively coated plastic articles which have sufficient resilience for use in automotive purposes. Therefore, in some embodiments, there is provided a plastic article (which can be formed by the method of the invention) which can pass one or more of the following tests:

Cross hatch adhesion: ISO 2409 using a single-blade cutting tool and 3M Scotch 8981 tape. Adhesion rating≤1.

Abrasion—steel wool: A 30 cm long skeen of 0 grade steel wool is folded into a 40 mm×40 mm square pad and fitted to a Sutherland Ink Rub Tester. 1.9 kg of force is applied onto the surface of the sample for 75 cycles.

Abrasion—scuff: A 30 cm long skeen of 0000 grade steel wool is folded into a 40 mm×40 mm square pad and fitted to a Sutherland Ink Rub Tester. 0.9 kg of force is applied onto the surface of the sample for 10 cycles.

Chemical resistance: A 300×300 mm cotton cloth is soaked in 50 mL of each reagent. The reagent-soaked cloth is place upon the coated surface and stored at laboratory ambient temperature for 48 hrs following which the reagent is removed and the coated surface is wiped with cheesecloth for 10 cycles. In some embodiment, the reagent is selected from the group consisting of one or more of: brake fluid, coolant, motor oil, isopropyl alcohol, automatic transmission fluid, Armor All™, hydraulic oil, Coca Cola™, window cleaner, Spray'n'wipe™, acid sweat, alkaline sweat, tar remover, chrome polish, chrome cleaner, Mortein™, white spirit, engine degreaser, car wash, 33% US washer fluid, 100% EU washer fluid.

Water immersion: The sample is immersed in water at 40° C. for 320 h.

Short term heat: The sample is exposed to 110° C. for 7 hours.

Thermal cycling: The sample is exposed to 10 cycles of 75° C.±2° C. 4 h transitioning to 38°±2° C. and 95%±5% relative humidity for 16 h followed by −30°±2° C. 4 h.

Thermal Shock: The sample is exposed to 200 cycles of −40° C. to 85° C., 1 hr/cycle.

Salt Spray: The sample is exposed to salt spray for 480 hours as per ASTM B 117.

High temperature ageing: The sample is exposed to 80° C. for 500 hours.

Low temperature ageing: The sample is exposed to −40° C. for 240 hours.

Humidity ageing: The sample is exposed to 40° C./95% RH for 500 hours.

UV resistance: 1250 kJ/m2 of Xenon Arc exposure as per SAEJ2527. Adhesion rating ≤1.

Figure 3:
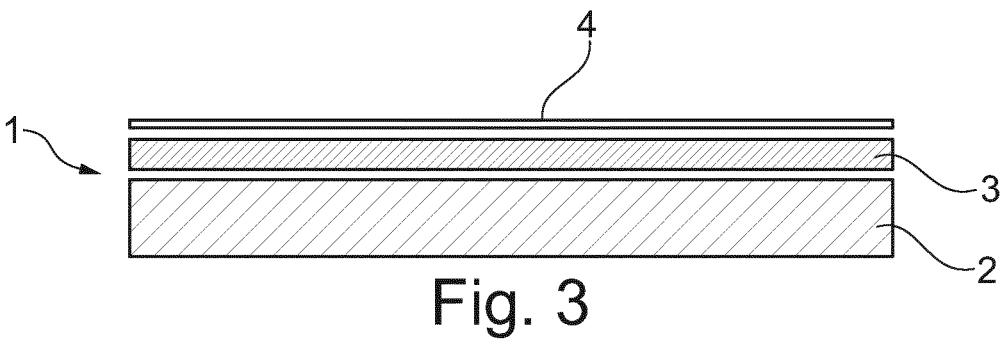
FIG. 3 illustrates an embodiment of the present invention comprising a substrate, a single layer of chromium and zirconium and a protective coating.

Turning to the remaining figures, a coated plastic article 1 produced by the method of the present invention is illustrated in FIG. 3. The coated plastic article 1 comprises a plastic substrate 2 having a first and second surface. The first surface is provided with a metal alloy layer 3 comprising chromium and zirconium deposited directly on the substrate 2 via physical vapour deposition. A protective coat 4 of Momentive PHC587B is provided to at least the outermost surface (which, in this illustrated embodiment, is the first surface of the article).

Figure 4:
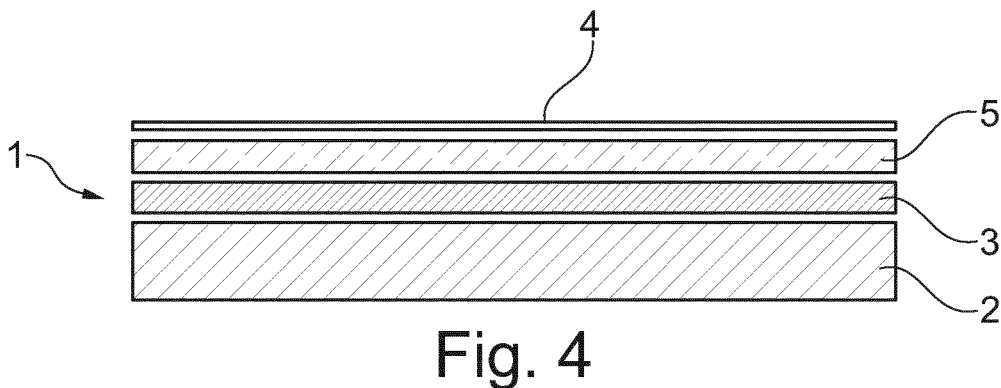
FIG. 4 illustrates an embodiment of the present invention comprising a substrate, a single layer of chromium and zirconium, a silicon dioxide layer and a protective coating.

A further embodiment of a coated plastic article 1 produced by the method of the present invention is illustrated in FIG. 4. The article has a decorative coating which comprises a layer 3 of a metal alloy of chromium and zirconium and an additional layer 5 of silicon dioxide. This two layered decorative coating is then coated with a protective coating 4.

15 16

Figure 5:
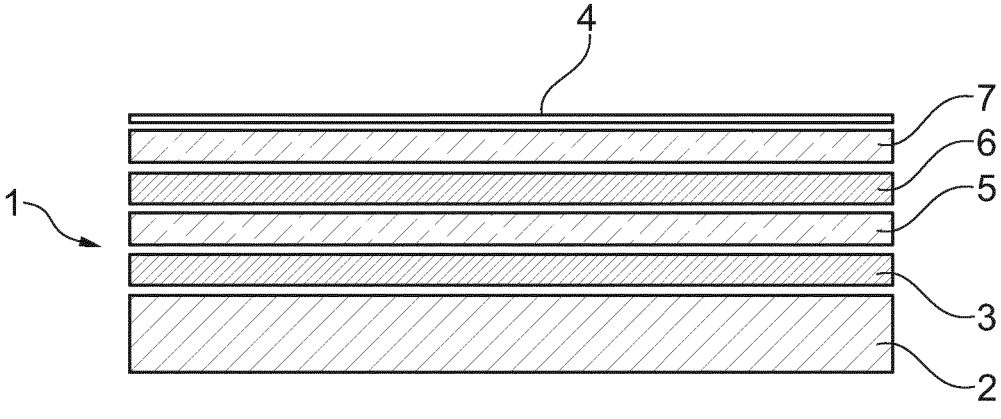
FIG. 5 illustrates an embodiment of the present invention comprising a substrate, a decorative coating stack comprising two layers of chromium and zirconium alloy alternating with two silicon dioxide layers and an outer protective coating.

FIG. 5 provides yet a further embodiment of a coated plastic article 1 produced by the method of the present invention. This embodiment comprises a decorative layer comprising a multilayer stack of chromium and chromium alloy layers 3 and 6 alternating with silicon dioxide layers 5 and 7. This four-layer decorative coating is then coated with a protective coating 4.

Figure 6:
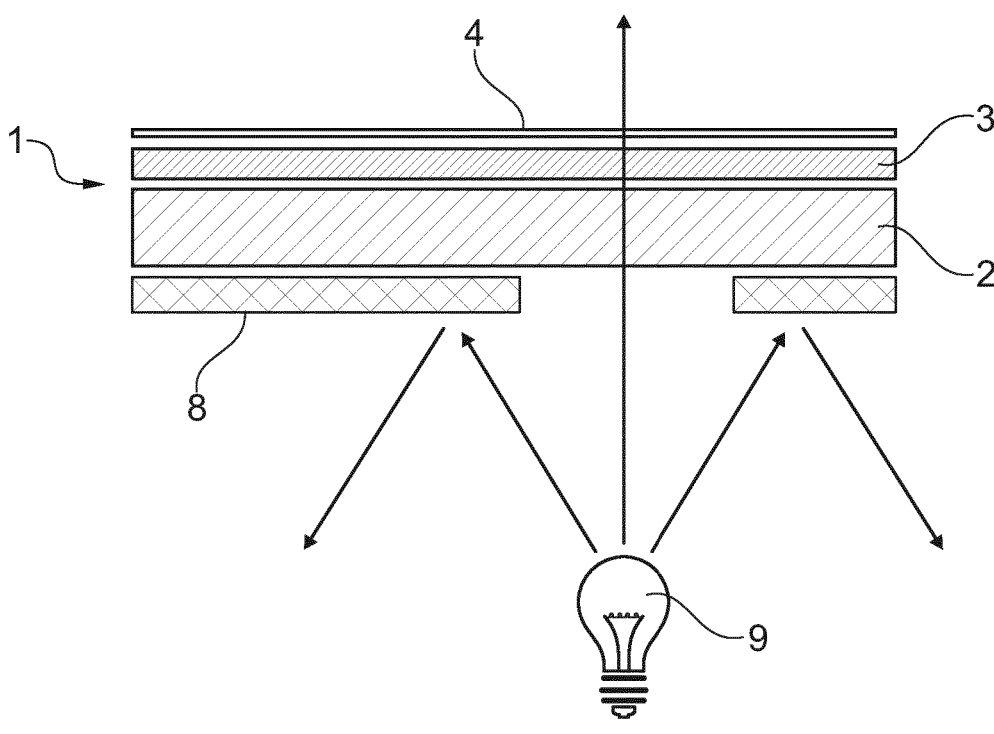
FIG. 6 illustrates an embodiment of the present invention having a back-lit symbol. The plastic article comprises a substrate having a second surface mask and a first surface decorative coating comprising a single layer of chromium and zirconium with an outer protective coating.

A further embodiment of a coated plastic article 1 produced by the method of the present invention is provided in FIG. 6. This plastic article is identical to that provided in FIG. 3, however, portions of the second side of the plastic article 1 is provided with a mask 8 which reduces light Sample 1: Plasma pre-treatment of polycarbonate substrate:silicon dioxide ($SiO_2$) layer:chromium/zirconium layer (CrZr):silicon dioxide ($SiO_2$) layer.

Sample 2: No plasma pre-treatment of polycarbonate substrate:silicon dioxide layer ($SiO_2$):chromium/zirconium (CrZr) layer:silicon dioxide layer ($SiO_2$).

Sample 3: No plasma pre-treatment of polycarbonate substrate:chromium/zirconium layer (CrZr):silicon dioxide layer ($SiO_2$).

The parameters of the PVD deposition and properties of deposited coatings are set out in table 1 below.

TABLE 1

| | | Sample 1 | | | Sample 2 | | | Sample 3 | |
|---|---|---|---|---|---|---|---|---|---|
| | Pre-Treatment^ | Layer 1 $SiO_2$^ | Layer 2 CrZr^ | Layer 3 $SiO_2$^ | Layer 1 $SiO_2$^ | Layer 2 CrZr^ | Layer 3 $SiO_2$^ | Layer 1 CrZr^ | Layer 2 $SiO_2$^ |
| Target power (kW) | 3 | | | | | | | | |
| Target power (kW) CrZr^ | | | 40 | | | 40 | | 40 | |
| Target power (kW) $SiO_2$^ | | 30 | | 18 | 30 | | 18 | | 18 |
| Total Gas flow (sccm) | 800 Ar 100 $O_2$ | 160 Ar 200 $O_2$ | 156 Ar 84 $N_2$ | 100 Ar 200 $O_2$ | 160 Ar 200 $O_2$ | 156 Ar 84 $N_2$ | 100 Ar 200 $O_2$ | 156 Ar 84 $N_2$ | 100 Ar 200 $O_2$ |
| RPM | 6 | 8.4 | 24 | 24 | 8.4 | 24 | 24 | 24 | 24 |
| Number of rounds | 12 | 9 | 9 | 20 | 9 | 9 | 20 | 9 | 20 |
| Base Pressure (mbar) | 8e-5 | 3e-5 | 3e-5 | 3e-5 | 3e-5 | 3e-5 | 3e-5 | 3e-5 | 3e-5 |
| Run Pressure (mbar) | 1e-2 | 2e-3 | 2e-3 | 1.6e-3 | 2e-3 | 2e-3 | 1.6e-3 | 2e-3 | 1.6e-3 |
| Thickness (nm) | 0 | 50 | 25 | 35 | 50 | 25 | 35 | 25 | 35 |

^Pre-treatment = Glow discharge electrodes (Stainless steel); CrZr target = Chromium/zirconium (98.5/1.5at %); $SiO_2$ target = Dual rotatable silicon target (99.90% purity).

transmissibility. In areas where the mask 8 is not provided, back lighting 9 of the plastic article 1 from the second side is visible through the semi-transparent metal alloy layer 3. This allows for the provision of back-lit symbols which are substantially invisible in the absence of back lighting.

EXAMPLES

The following examples provide specific embodiments of the invention disclosed herein and are not intended to limit the invention as claimed.

Stainless Steel Brushed Metallic Look Coating

Various plastic articles having brushed stainless-steel appearances with a gloss protective coating were prepared via the following protocols.

Substrate Preparation

A polycarbonate substrate was injection moulded using a patterned injection mould tool and stored in a manner to avoid contamination of the substrate until application of the coating.

Prior to coating the substrate was blown off thoroughly with ionised compressed air to remove any particulate that had settled on the surface and to remove static. The substrate was then loaded into the PVD coating drum and blown off a second time immediately prior to entering the vacuum coating chamber.

Deposition of the Decorative Coatings

Three separated coating protocols were performed to permit assessment of the utility and resilience of the coated plastic articles. The three protocols are as follows:

Protective Coating

A coating of Momentive PHC587B was applied to the plastic articles. This outer protective coating covers and protects the decorative coating by improving its UV resistance and abrasion resistance. Accordingly, the protective coating acts as a hard-coating, and as a UV resistant coating.

The outer coating was applied by an automated dip-coating facility as set out below and following parameter set out in Table 2. The coated substrate was left for 10 minutes to allow evaporation of the solvents until the surface was substantially tack-free. Subsequently, the coated substrate was cured for 71 minutes at 130° C. in a curing oven to provide a protective hard-coated surface.

Specifically, the following parameters were used to apply the protective coating:

TABLE 2

| Protective coating deposition parameters | |
|---|---|
| Parameter | Details |
| Material | Momentive PHC-587B |
| Deposition Method | Dip coated and cured at 130° C. |
| Thickness (μm) | 7-9 um |

Satin Metallic-Look Coating

Various plastic articles having a satin metallic-look were prepared via the following protocols.

Substrate Preparation

A polycarbonate substrate was injection moulded to the desired shape and stored in a manner to avoid contamination of the substrate until application of the coating.

Prior to coating the substrate was blown off thoroughly with ionised compressed air to remove any particulate that had settled on the surface and to remove static. The substrate was then loaded into the PVD coating drum and blown off a second time immediately prior to entering the vacuum coating chamber.

Deposition of the Decorative Coatings

Four separated coating protocols were performed to permit assessment of the utility and resilience of the coated plastic substrates. The four protocols are as follows:

Samples 4 to 6: No plasma pre-treatment of polycarbonate substrate:chromium/zirconium layer (CrZr):silicon dioxide (SiO$_2$) layer.

Sample 7: No plasma pre-treatment of polycarbonate substrate:chromium/zirconium (CrZr) layer:silicon dioxide layer (SiO$_2$):chromium/zirconium (CrZr) layer:silicon dioxide layer (SiO$_2$).

The parameters of the PVD deposition and properties of deposited coatings are set out in Table 3 below.

18

Specifically, the following parameters (as set out in Table 4) were used to provide the satin decorative coating:

TABLE 4

| Satin hard-coat deposition parameters | |
| --- | --- |
| Parameter | Details |
| Material | Momentive PHC-587B + Tospearl 2000B (at 3.5% wt/wt) |
| Deposition Method | Spray coated and cured at 130° C. |
| Thickness (μm) | 8-16 um |

Results

Measuring Tensile Stress

Film stress was measured by depositing the PVD films on thin glass (150 um) microscope cover slides and assessing the residual stress of the coating using a Sigma Physik

TABLE 3

| | PVD coating parameters and properties | | | | | | | | | |
| --- | --- | --- | --- | --- | --- | --- | --- | --- | --- | --- |
| | Example 4 | | Example 5 | | Example 6 | | Example 7 - Dark satin | | | |
| | Layer 1 | Layer 2 | Layer 1 | Layer 2 | Layer 1 | Layer 2 | Layer 1 | Layer 2 | Layer 3 | Layer 4 |
| Parameter | CrZr^ | SiO$_2$^ | CrZr | SiO$_2$^ | CrZr^ | SiO$_2$^ | CrZr^ | SiO$_2$^ | CrZr^ | SiO$_2$^ |
| Glow discharge electrodes (Stainless steel) | | | | | | | | | | |
| Target power (kW) CrZr | 42 | | 47 | | 53 | | 9.5 | | 9.5 | |
| Target power (kW) SiO$_2$^ | | 18 | | 18 | | 18 | | 18 | | 18 |
| Total Gas flow (sccm) | 240 Ar | 100 Ar 200 O$_2$ | 450 Ar | 100 Ar 200 O$_2$ | 600 Ar | 100 Ar 200 O$_2$ | 200 Ar | 100 Ar 200 O$_2$ | 200 Ar | 100 Ar 200 O$_2$ |
| RPM | 24 | 24 | 24 | 24 | 24 | 24 | 24 | 24 | 24 | 24 |
| Number of rounds | 8 | 20 | 8 | 20 | 8 | 20 | 7 | 82 | 14 | 25 |
| Base Pressure (mbar) | 3e−5 | 3e−5 | 3e−5 | 3e−5 | 3e−5 | 3e−5 | 2e−5 | 2e−5 | 2e−5 | 2e−5 |
| Run Pressure (mbar) | 2.5e−3 | 1.6e−3 | 5.2e−3 | 1.6e−3 | 1.3e−2 | 1.6e−3 | 1.3e−3 | 1.5e−3 | 2e−3 | 1.5e−3 |
| Thickness (nm) | 25 | 35 | 25 | 35 | 25 | 35 | 4 | 107 | 15.5 | 44 |

^Pre-treatment = Glow discharge electrodes (Stainless steel); CrZr target = Chromium/zirconium (98.5/1.5at %); SiO$_2$ target = Dual rotatable silicon target (99.90% purity).

Protective Surface Coating—Satin

To provide a satin metallic look and to protect the decorative coating, a protective coat of Momentive PHC587B was applied to the outer surface of the decorative coating. This protective coating differed from that used in examples 1 to 3 in two ways. Firstly, the Momentive PHC587B included an additive that resulted in diffusion of visible light, thereby creating a satin finish. Secondly, rather than dip coating, the protective coating was applied by automated spraying in a dedicated thin film coating spray booth. This resulted in a coating only on the first side of the plastic substrate (i.e. the coating was applied only to the decorative coated side) and not the second, non-coated, side.

The coated substrate was left for 10 minutes to allow evaporation of the solvents until the surface was substantially tack-free. Subsequently, the coated substrate was cured for 71 minutes at 130° C. in a curing oven to provide a protective hard-coated surface.

SIG-500SP device. This unit provides a measurement output for stress displacement (um) and stress (MPa).

The device uses two parallel laser beams which are positioned nominally 20 mm apart. A sensor is positioned to detect the distance between the two beams reflected from the glass slide, thereby allowing determination of the curvature of the slide. A measurement is taken before and after the physical vapour deposition of the decorative coating on the slide a comparison of the two measurements allows calculation of the stress displacement (μm). In essence a film with a compressive residual stress profile will result in a convex curvature of the coated glass slide (i.e. the edges of the slide will curve in the direction away from the film coated side), while a film having tensile residual stress will have a concave profile (the edges of the slide will curve in the direction of the film coated side). This displacement can be converted to MPa by taking into account the thickness of the glass slide and film.

Figure 7:
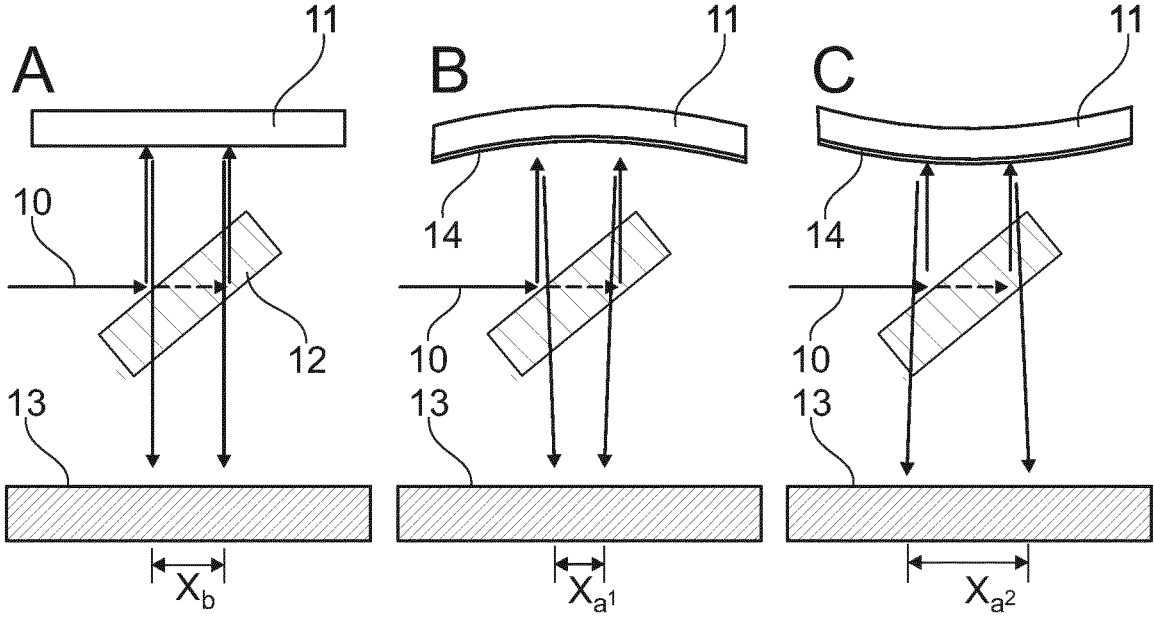
FIG. 7 illustrates an exemplified method for determining the stress displacement (um) of the decorative coating.

FIG. 7 shows a schematic of the measurement of the stress displacement of the decorative coatings of the disclosed samples. FIG. 7A illustrates an incidental light beam 10 which is split in two and directed toward a glass slide substrate 11 via a semi-transparent mirror 12. A portion of the light beam is reflected off the glass slide 11 onto a sensor 13. The Distance between the two light beams of an untreated slide is determined ($X_b = X_{before}$). FIG. 7B illustrates the distortion of the glass slide 11 which results from the deposition of a coating 14 having residual tensile stress. As can be seen the glass slides forms a concave curvature, with the edges of the slide curving toward to the decorative coating 14. This curvature results in convergence at the sensor 13 of the light beams reflected from the coated substrate, which is measured as a second distance ($X_{a1}$) ($X_a = X_{after}$).

FIG. 7C illustrates the distortion of a glass slide 11 which results from the deposition of a coating 14 having compressive residual stress. In opposition to a coating having tensile residual stress, the slide forms a convex curvature with the edges of the slide curving away from the coating 14. This results in the divergence at the sensor 13 of the light beams reflected from the coated substrate, which is measured as a second distance ($X_{a2}$).

The stress displacement of a deposited film is then calculated using the formula:

$$\text{Stress displacement } (\mu m) = X_a - X_b$$

As is apparent, a coating having a tensile residual stress will provide a negative stress displacement in μm (i.e. $X_{a1} < X_b$), while a coating having a compressive residual stress will provide a positive measurement (i.e. $X_{a2} > X_b$).

In the present context the magnitude of strain at the interface of the substrate and the films is important in promoting adhesion between the substrate and the film. This magnitude of strain is best measured and compared by recording the deflection (stress displacement (μm)) of the glass slide. The stress displacement measurement incorporates the thickness of the coating as opposed to stress reported in MPa. Accordingly, a thick coating having a low residual stress (as measured by MPa) will apply the same stress displacement on the substrate as a thinner coating with a relatively higher residual stress (as measured in MPa). As a result, measurement of the residual stress in MPa is appropriate when coating thicknesses are the same but does not allow direct comparison when the thickness of the coating varies. Accordingly, film stress is reported herein as stress displacement (μm) and all measurements were taken prior to the addition of the protective coating.

Further, the reflectance and transmissibility of the coated plastic article was assessed with a HunterLab Ultrascan Pro Spectrophotometer.

The results of the assessment of residual stress and visual assessment are provided in Table 5 below.

TABLE 5

| | | | | | | | |
|---|---|---|---|---|---|---|---|
| Residual stress, light reflectance and light transmittance of the coated plastic samples | | | | | | | |
| Sample | 1 | 2 | 3 | 4 | 5 | 6 | 7 |
| Residual film stress displacement (um) | +250 | −50 | −240 | −765 | −1100 | | +435 |
| Residual Stress | Compressive | | >>Tensile>> | | | | Compressive |
| Reflected L* with protective coating[#] | 67 | | | 79 | | | 50 |
| Transmitted L* with protective coating[#] | 28 | | | 30 | | | 38 |

[#]Reflected and Transmitted L* assessed via (CIEL*a*b*) using HunterLab Ultrascan Pro Spectrophotometer.

To assess if samples prepared as described above would be sufficiently robust for use in automotive applications a series of durability tests were performed.

The tests performed and the outcomes are summarized in Table 6 below.

TABLE 6

| | | | | | | | |
|---|---|---|---|---|---|---|---|
| Durability testing of coated samples | | | | | | | |
| | Result | | | | | | |
| Test | Sample 1 | Sample 2 | Sample 3 | Sample 4 | Sample 5 | Sample 6 | Sample 7 |
| Cross hatch adhesion | PASS | PASS | PASS | PASS | PASS | PASS | PASS |
| Abrasion - steel wool | PASS | PASS | PASS | PASS | PASS | PASS | PASS |
| Abrasion - scuff | PASS | PASS | PASS | PASS | PASS | PASS | PASS |
| Chemical resistance | PASS | PASS | PASS | PASS | PASS | PASS | PASS |
| Water immersion | PASS | PASS | PASS | PASS | PASS | PASS | PASS |
| Short term heat | PASS | PASS | PASS | PASS | PASS | PASS | PASS |
| Thermal cycling | PASS | PASS | PASS | PASS | PASS | PASS | PASS |
| Thermal Shock | PASS | PASS | PASS | PASS | PASS | PASS | PASS |
| Salt Spray | PASS | PASS | PASS | PASS | PASS | PASS | PASS |

TABLE 6-continued

Durability testing of coated samples

| | Result | | | | | | |
|---|---|---|---|---|---|---|---|
| Test | Sample 1 | Sample 2 | Sample 3 | Sample 4 | Sample 5 | Sample 6 | Sample 7 |
| High temperature ageing | PASS | PASS | PASS | PASS | PASS | PASS | PASS |
| Low temperature ageing | PASS | PASS | PASS | PASS | PASS | PASS | PASS |
| Humidity ageing | PASS | PASS | PASS | PASS | PASS | PASS | PASS |
| UV resistance | FAIL 87 kJ/m2 | FAIL 370 kJ/m2 | PASS | PASS | PASS | PASS | FAIL 640 kJ/m2 |
| Residual stress displacement (μm) | +250 | | −50 | −240 | −765 | −1100 | +435 |

A description of each of the tests performed in Table 6 is provided below:

Cross hatch adhesion: ISO 2409 was performed using a single-blade cutting tool and 3M Scotch 8981 tape. Adhesion rating ≤1.

Abrasion—steel wool: A 30 cm long skeen of 0 grade steel wool was folded into a 40 mm×40 mm square pad and fitted to a Sutherland Ink Rub Tester. 1.9 kg of force was applied onto the surface of the sample for 75 cycles.

Abrasion—scuff: A 30 cm long skeen of 0000 grade steel wool was folded into a 40 mm×40 mm square pad and fitted to a Sutherland Ink Rub Tester. 0.9 kg of force was applied onto the surface of the sample for 10 cycles.

Chemical resistance: A 300×300 mm cotton cloth was soaked in 50 mL of each reagent, the soaked cloth was then applied to the coated surface and store at laboratory ambient temperature for 48 hrs (unless noted otherwise) following which the reagent shall be removed from the coated surface which is then wiped with cheesecloth for 10 cycles. The reagents used were: brake fluid, coolant, motor oil, isopropyl alcohol, automatic transmission fluid, Armor All™, hydraulic oil, Coca Cola™, window cleaner, Spray'n'wipe™, acid sweat, alkaline sweat, tar remover, chrome polish, chrome cleaner, Mortein™, white spirit, engine degreaser, car wash, 33% US washer fluid, 100% EU washer fluid.

Water immersion: The sample was immersed in water for 320 h and kept at 40° C.

Short term heat: The sample was exposed to 110° C. for 7 hours.

Thermal cycling: The sample was exposed to 10 cycles of: 75°±2° C. for 4 h followed by 38°±2° C., 95%±5% relative humidity for 16 h followed by −30°±2° C. for 4 h.

Thermal Shock: The sample was exposed to 200 Cycles −40° C. to 85° C., 1 hr/cycle.

Salt Spray: The sample was exposed to salt spray for 480 hours as per ASTM B 117.

High temperature ageing: The sample was exposed to 80° C. for 500 hours.

Low temperature ageing: The sample was exposed to −40° C. for 240 hours.

Humidity ageing: The sample was exposed to 40° C., 95% relative humidity for 500 hours.

UV resistance: 1250 kJ/m2 of Xenon Arc exposure was provided to the sample as per SAEJ2527. Adhesion rating ≤1.

As can be noted from Table 5, all samples passed each durability test performed, with the exception of UV resistance (as per SAEJ2527). When exposed to UV radiation, four of the seven samples passed and the other three failed. Notably, all three of the samples that failed had decorative coatings with a residual stress displacement that was compressive. Therefore, it can be concluded that, based on these results, the residual film stress displacement of the decorative coating needs to be tensile for the plastic article to be suitable for automotive applications, such as interior automotive applications.

It is to be understood that various modifications, additions and/or alternatives may be made to the parts previously described without departing from the ambit of the present invention as defined in the provisional claims appended hereto.

The invention may also be said broadly to consist in the parts, elements and features referred to or indicated in the specification of the application, individually or collectively, in any or all combinations of two or more of said parts, elements or features. Where, in the foregoing description reference has been made to integers or components having known equivalents thereof, those integers are herein incorporated as if individually set forth.

Where any or all of the terms "comprise", "comprises", "comprised" or "comprising" are used in this specification (including the provisional claims) they are to be interpreted as specifying the presence of the stated features, integers, steps or components, but not precluding the presence of one or more other features, integers, steps or components or group thereof.

Future patent applications may be filed in any qualifying jurisdiction on the basis of, or claiming priority from, the present application. It is to be understood that the following provisional claims are provided by way of example only and are not intended to limit the scope of what may be claimed in any such future application. Features may be added to or omitted from the provisional claims at a later date so as to further define or re-define the invention or inventions.

The invention claimed is:

1. A method for producing a coated plastic article, the method comprising:

providing a plastic substrate having at least a first surface and a second surface, wherein the plastic substrate is polycarbonate;

depositing on the first surface of the polycarbonate plastic substrate a decorative coating comprising a metal alloy layer, using physical vapor deposition; and applying a protective coating to at least the first surface of the plastic article, wherein there is no plasma pre-treatment of the polycarbonate plastic substrate prior to deposition of the decorative coating, wherein the metal alloy layer of the decorative coating is deposited directly on the polycarbonate plastic substrate under conditions that result in a tensile residual film stress of the decorative coating, and wherein the residual film stress displacement of the decorative coating is less than or equal to −50 μm, and wherein the metal alloy layer comprises chromium and zirconium.

2. The method of claim 1, wherein the decorative coating is deposited under conditions that result in a residual film stress displacement of the decorative coating of less than or equal to −240 μm.

3. The method of claim 1, wherein the decorative coating is deposited under conditions that result in a residual film stress displacement of the decorative coating of less than or equal to −765 μm.

4. The method of claim 1, wherein the protective coating is a hard-coating.

5. The method of claim 1, wherein the protective coating is an ultraviolet blocking coating.

6. The method of claim 1, wherein the protective coating is applied to the decorative coating.

7. The method of claim 1, wherein the protective coating is applied to the decorative coating and the opposing surface of the plastic substrate.

8. The method of claim 1, wherein the decorative coating comprises an adhesion promoting layer.

9. The method of claim 1, wherein the decorative coating comprises an optical modifying layer.

10. The method of claim 8, wherein the adhesion promoting layer is transparent.

11. The method of claim 9, wherein the optical modifying layer is transparent.

12. The method of claim 8, wherein the adhesion promoting layer comprises silicon.

13. The method of claim 9, wherein the optical modifying layer comprises silicon.

14. The method of claim 12, wherein the adhesion promoting layer is deposited in the presence of oxygen.

15. The method of claim 13, wherein the optical modifying layer is deposited in the presence of oxygen.

16. The method of claim 8, wherein the deposited adhesion promoting layer is silicon dioxide.

17. The method of claim 9, wherein the deposited optical modifying layer is silicon dioxide.

18. The method of claim 1, wherein the provided plastic substrate comprises visible texturing prior to deposition of the decorative coating.

19. The method of claim 1, further comprising providing a visible texturing to the plastic substrate.

20. The method of claim 1, further comprising providing two visually distinct textures to the plastic substrate.

21. The method of claim 1, wherein the plastic substrate has been injection molded or is formed of a plastic which is capable of being injection molded.

22. The method of claim 1, wherein the metal alloy layer of the decorative coating is deposited directly on the polycarbonate plastic substrate without a base hard-coat being previously applied to the plastic substrate.

23. The method of claim 1, wherein the residual stress of the coated plastic article is tensile.

\* \* \* \* \*